(12) United States Patent
Barlocchi et al.

(10) Patent No.: US 6,277,703 B1
(45) Date of Patent: Aug. 21, 2001

(54) METHOD FOR MANUFACTURING AN SOI WAFER

(75) Inventors: Gabriele Barlocchi, Cornaredo; Flavio Francesco Villa, Milan, both of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/311,889

(22) Filed: May 14, 1999

(30) Foreign Application Priority Data

May 15, 1998 (EP) .................................................. 98830299

(51) Int. Cl.⁷ .................................................. H01L 21/76
(52) U.S. Cl. .......................... 438/412; 438/479; 438/221
(58) Field of Search .................................... 438/411, 412, 438/441, 479, 481, 409, 221

(56) References Cited

U.S. PATENT DOCUMENTS

| 4,760,036 | 7/1988 | Schubert | 437/90 |
| 4,910,165 | 3/1990 | Lee et al. | 437/90 |
| 4,948,456 | 8/1990 | Schubert | 156/611 |
| 5,115,289 | 5/1992 | Hisamoto et al. | 357/23.7 |
| 5,208,167 | 5/1993 | Nakamura | 437/21 |
| 5,635,411 | 6/1997 | Takasu | 438/311 |
| 6,020,250 | * 2/2000 | Kenney | 438/422 |

FOREIGN PATENT DOCUMENTS

| 0 223 694 A2 | 5/1987 | (EP) . |
| 0 226 091 A2 | 6/1987 | (EP) . |
| 0 488 344 A2 | 6/1992 | (EP) . |
| 2 489 041 | 2/1982 | (FR) . |
| 2 156 149 | 10/1985 | (GB) . |
| 01307241 | 12/1989 | (JP) . |
| 05343320 | 12/1993 | (JP) . |

OTHER PUBLICATIONS

Zorinsky, E.J. et al., "The 'Islands' Method—A Manufacturable Porous Silicon SOI Technology." *IEEE*, 2:431–434, 1986.

French, P.J. et al., "Epi–micromachining," *Microelectronics Journal*, 28:449–464, 1997.

\* cited by examiner

*Primary Examiner*—Olik Chaudhuri
*Assistant Examiner*—Ginette Peralta
(74) *Attorney, Agent, or Firm*—Theodore E. Galanthay; Robert Iannucci; Seed IP Law Group, PLLC

(57) ABSTRACT

A method including: forming doped regions on a monocrystalline substrate; growing an epitaxial layer; forming trenches in the epitaxial layer extending to the doped regions; anodizing the doped regions in an electro-galvanic cell to form porous silicon regions; oxidizing the porous silicon regions; removing the oxidized porous silicon regions to form a buried air gap; thermally oxidizing the substrate to grow an oxide region from the walls of the buried air gap and the trenches, until the buried air gap and the trenches themselves are filled.

12 Claims, 5 Drawing Sheets

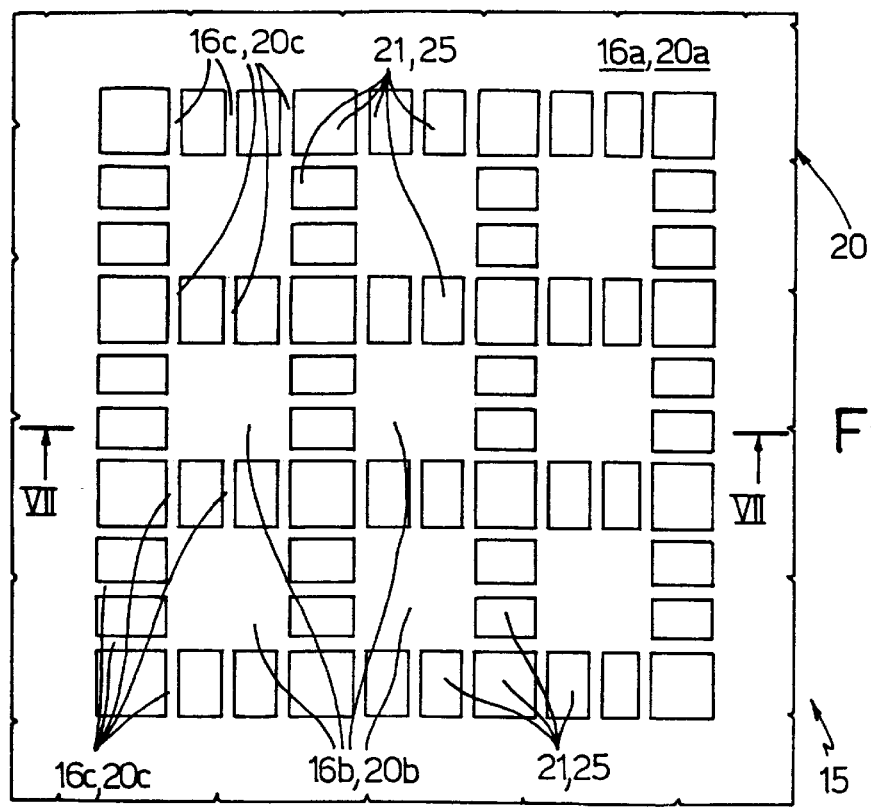
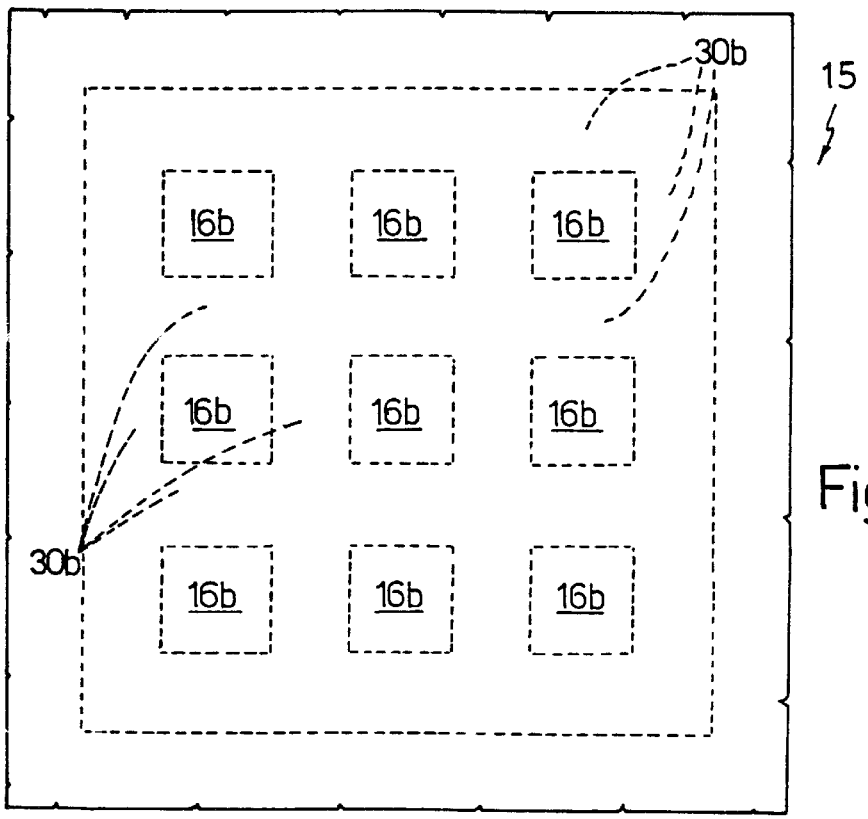

METHOD FOR MANUFACTURING AN SOI WAFER

CROSS-REFERENCE TO RELATED APPLICATION

This application is related to U.S. patent application Ser. No. 09/229,597,

TECHNICAL FIELD

The present invention relates to a method for manufacturing an SOI wafer.

BACKGROUND OF THE INVENTION

As known, according to a solution that is currently very widespread in the microelectronics industry, substrates of integrated devices are often formed from wafers of monocrystalline silicon. In the last few years, as an alternative to wafers consisting of silicon alone, composite wafers, so-called "SOI" (Silicon-on-Insulator) wafers have been proposed, having two silicon layers, one of which is thinner than the other, separated by a silicon oxide layer (see for example the article "Silicon-on-Insulator Wafer Bonding Wafer Thinning Technological Evaluations" by J. Hausman, G. A. Spierings, U. K. P. Bierman and J. A. Pals, Japanese Journal of Applied Physics, Vol. 28, No. 8, August 1989, pp. 1426–1443).

Attention has recently been paid to SOI wafers, since integrated circuits that have a substrate formed from wafers of this type have advantages compared with similar circuits formed on conventional substrates, i.e. consisting of monocrystalline silicon alone. These advantages can be summarized as follows:

a) faster switching speed;

b) greater noise immunity;

c) smaller loss currents;

d) elimination of parasitic component switching phenomena ("SCR latch-up");

e) reduction of parasitic capacitances;

f) greater resistance to radiation effects; and g) greater packing density of the components.

A typical process for manufacturing SOI wafers is described in the aforementioned article, and is based on physically uniting two monocrystalline silicon wafers ("wafer bonding" process). In particular, according to this process, one of the two wafers is oxidized, and after cleaning operations, is bonded to the other wafer. After thermal annealing, the outer surface of the oxidized wafer is ground and then polished until the required thickness is obtained (for example 1$\mu$m). An epitaxial layer for integrating electronic components is subsequently optionally grown on the thinner monocrystalline silicon layer. The wafers obtained through the conventional wafer bonding method have excellent electrical characteristics, but have undeniably high costs (approximately six times greater than the cost of the standard substrates).

Other methodologies, such as ZHR, SIMOX, etc., are described in the article "SOI Technologies: Their Past, Present and Future" by J. Haisha, Journal de Physique, Colloque C4, Supplément à no. 9, Tome 49, September 1988. These latter techniques have also not yet reached an industrial acceptance, and have some limitations. In fact, they do not provide layers of monocrystalline silicon on large oxide areas. They often have high levels of defects owing to the dislocations generated by stresses induced by the buried oxide, or they do not support formation of high voltage components as with SIMOX technology, where the oxide thickness obtained by oxygen implantation is approximately 100–200 nm.

SUMMARY OF THE INVENTION

The present invention, in one aspect, provides a method for manufacturing SOI wafers, which exploits the intrinsic advantages of microfabrication technologies, but at competitive costs. This method can employ presently available, standard, fully monocrystalline substrates.

In one aspect, the present invention includes a method for manufacturing an SOI wafer comprising: forming, inside a wafer of monocrystalline semiconductor material having a surface, a buried air gap and trenches extending between the buried air gap and the surface; and forming an oxide region inside the buried air gap and the trenches.

In another aspect, the present invention includes a silicon-on-insulator wafer. The wafer includes a substrate of monocrystalline semiconductor material, a plurality of monocrystalline epitaxial regions and an oxide region. The oxide region includes a lower portion interposed between the substrate and the monocrystalline epitaxial regions, and vertical portions extending between the lower portion and an upper surface of the SOI wafer, isolating the monocrystalline epitaxial regions from each other.

In one aspect of the invention, the oxide region is formed by forming a series of implanted regions on a surface of the substrate. The implanted regions have a conductivity different than that of the substrate. An epitaxial layer is grown on the surface of the substrate and on the implanted regions. Trenches are etched through the epitaxial layer to expose portions of the implanted regions, and the implanted regions are selectively removed to convert portions of the epitaxial layer to islands each having a lower surface separated from the surface of the substrate by a gap. Exposed surfaces of the islands and the substrate are oxidized to fill the gaps with silicon dioxide.

BRIEF DESCRIPTION OF THE DRAWINGS

A preferred embodiment of the present invention is now described, purely by way of non-limiting example, with reference to the attached drawings, wherein:

FIG. 8 shows a plan view of the wafer of FIG. 7, in accordance with an embodiment of the present invention;

FIG. 14 shows a plan view of the wafer of FIG. 12, in accordance with an embodiment of the present invention.

DETAILED DESCRIPTION OF THE INVENTION

Figure 1:
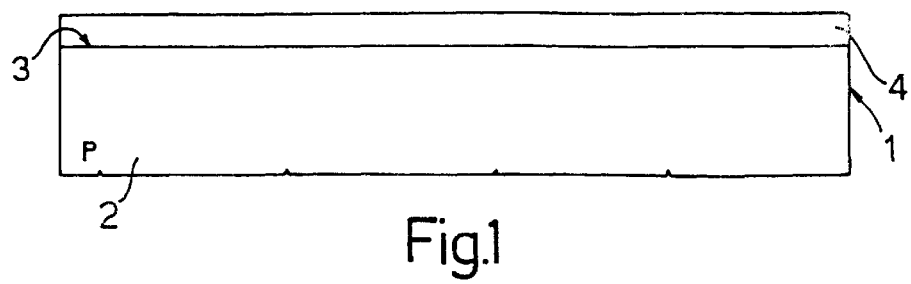
FIGS. 1–7 show cross-sections of an SOI wafer in successive manufacturing steps, in accordance with an embodiment of the present invention.

According to the embodiment of FIG. 1, a wafer 1, formed by a substrate 2 of P-type monocrystalline silicon, is initially subjected to a standard thermal oxidation step, to grow a first silicon oxide layer 4 having a thickness of, for example, 2000–5000 Å on one of its surfaces 3.

Figure 2:
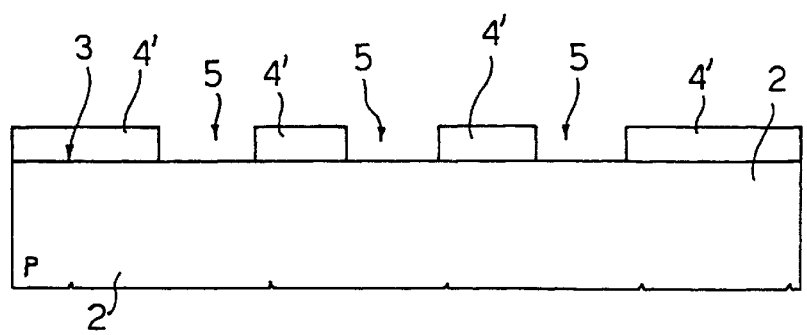
Figure 3:
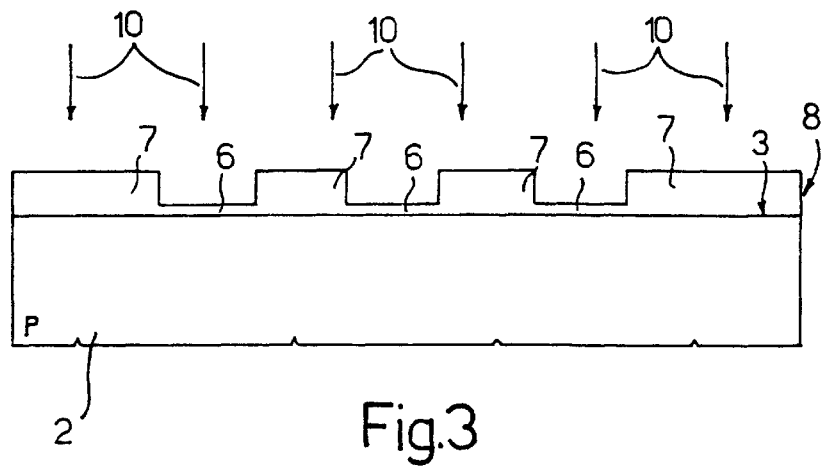

Subsequently, through photoresist deposition and conventional exposure and development, areas are defined where the first oxide layer 4 is removed to provide the intermediate structure of FIG. 2. In FIG. 2, the remaining portions of the first oxide layer 4 are indicated at 4' and delimit between them apertures 5, where the surface 3 of substrate 2 is uncovered. A light shielding oxidation is then carried out, which leads to the growth of a second thin oxide layer that, at the apertures 5, forms shielding portions 6 of a thickness of, for example, 200 Å, and elsewhere is joined to portions 4', forming protective portions 7. The protective portions 7 and the shielding portions 6 together form a shielding layer 8, as shown in FIG. 3.

Figure 4:
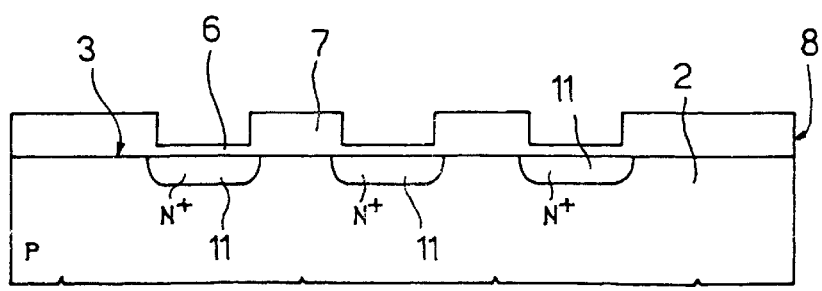

Subsequently, a high dose of arsenic or antimony is implanted, as shown schematically in FIG. 3 by arrows 10. In this step, the shielding portions 6 permit passage and implantation of the incident ions inside the substrate 2, but attenuate impact with the surface 3 so as to reduce damage to the surface 3 itself. The protective portions 7 block implantation of ions inside the underlying portions of the substrate 2. At the end of implantation, drive-in diffusion is carried out at a high temperature, to activate the ions implanted in the substrate 2, to provide $N^+$ regions 11, as shown in FIG. 4.

Figure 5:
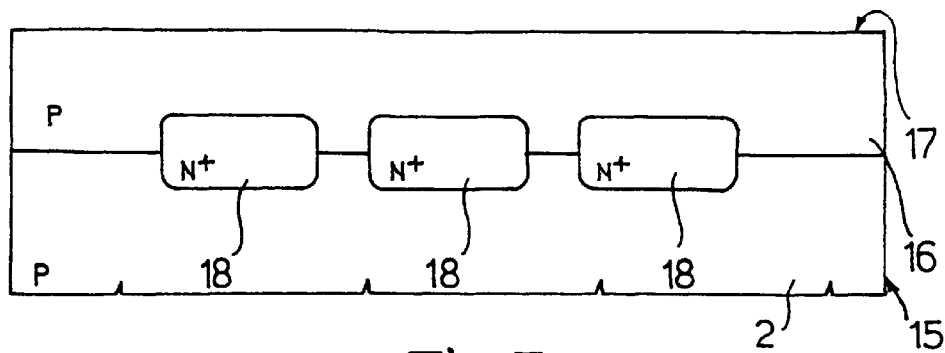

Shielding layer 8 is then completely removed, and a p-type epitaxial layer 16 is grown. In one embodiment, the p-type layer 16 has the same concentration as the substrate 2. At the end of the epitaxial growth, the wafer 15 of FIG. 5 is obtained. The wafer 15 includes the substrate 2, the epitaxial region 16 (of P-doped monocrystalline silicon having a surface 17), and buried $N^+$ regions 18.

Figure 6:
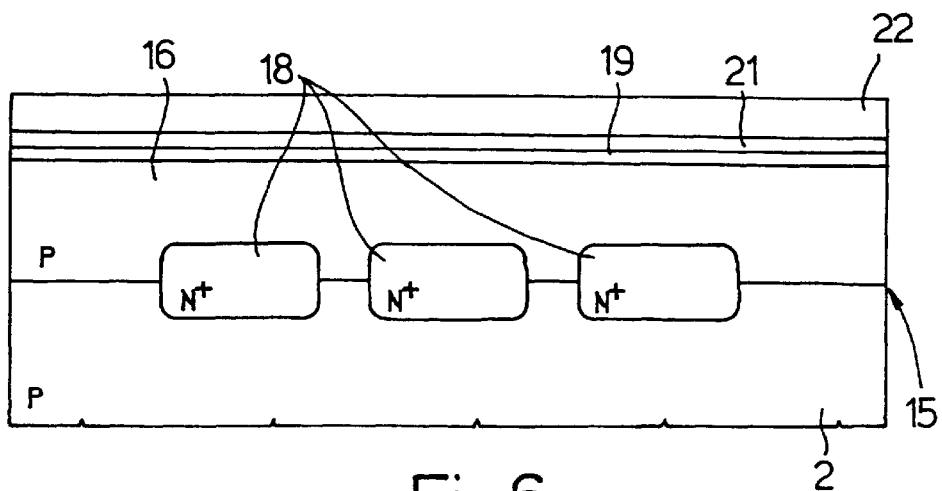

In accordance with an embodiment of the present invention, a masking layer is then formed. For example, a third silicon oxide layer 19 is grown (with a thickness of for example 200–600 Å, in one embodiment), then in succession a silicon nitride layer 21 (with a thickness of between 900 and 1500 Å, in one embodiment) and a TEOS (tetraethylortbosilicate) formed oxide layer 22 (with a thickness of between 5000 and 7000 Å, in one embodiment) are deposited. The intermediate structure of FIG. 6 is thus obtained.

Figure 7:
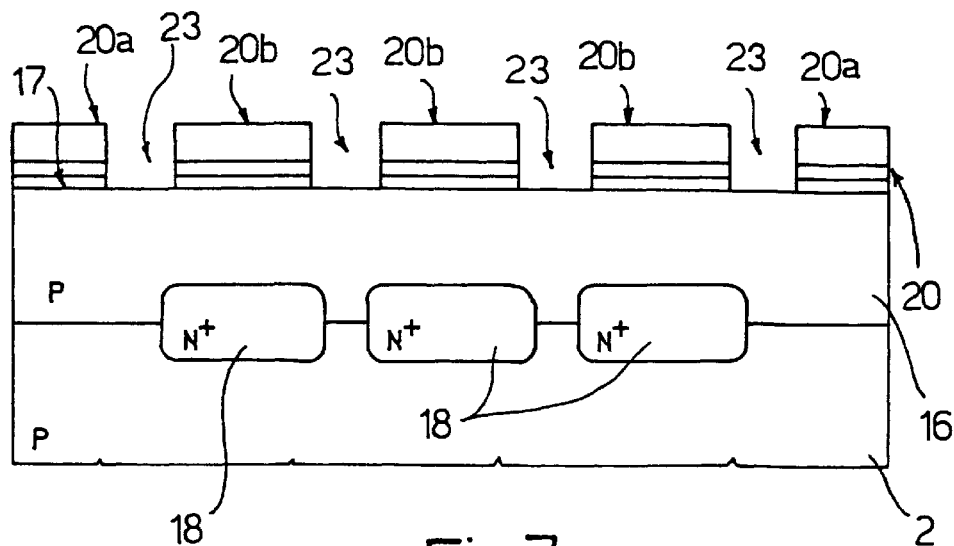

Through further resist deposition and patterning, the TEOS oxide 22, silicon nitride 21 and silicon oxide 19 layers are etched, forming a hard mask 20. Thus, the intermediate structure of FIG. 7 is obtained.

In particular (see also the plan view of FIG. 8), the hard mask 20 has an outer portion 20a covering the surface of wafer 15 on the exterior of the portion accommodating the buried regions 18, inner portions 20b aligned with the buried regions 18 and connection portions 20c connecting the inner portions 20 to one another and to the outer portion 20a, for reasons that will be explained hereinafter. As can be seen in FIG. 8, the connection portions 20c have a much smaller area than the inner portions 20b. Portions 20a, 20b and 20c form between them apertures 23, where the surface 17 of the epitaxial layer 16 is uncovered.

Figure 9:
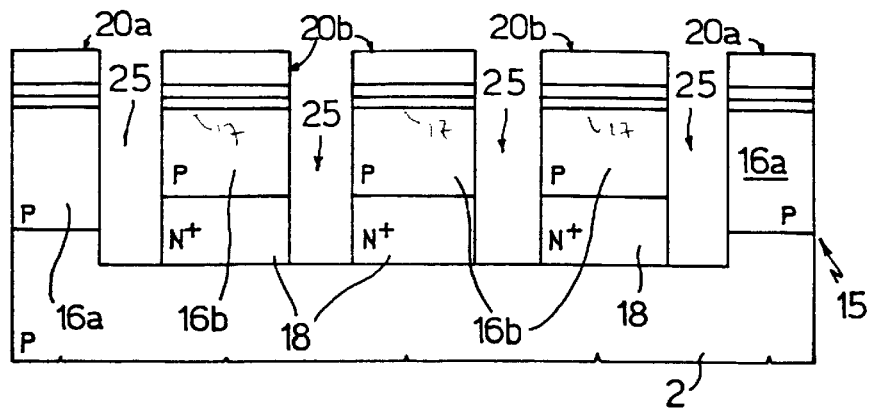
FIGS. 9–13 show cross-sections of the present SOI wafer in further manufacturing steps, in accordance with an embodiment of the present invention.

After defining the hard mask 20, the epitaxial layer 16 is etched at the apertures 23 by trench etching, forming trenches 25 that extend from the surface 17 to the buried regions 18, as shown in FIG. 9. The epitaxial layer 16 is now divided into an outer epitaxial region 16a, the shape of which corresponds to that of mask portion 20a; inner epitaxial regions or islands 16b, the shapes of which correspond to those of portions 20b; and epitaxial connection regions or pillars 16c (see FIG. 8), the shapes of which correspond to those of portions 20c of the mask 20.

Figure 10:
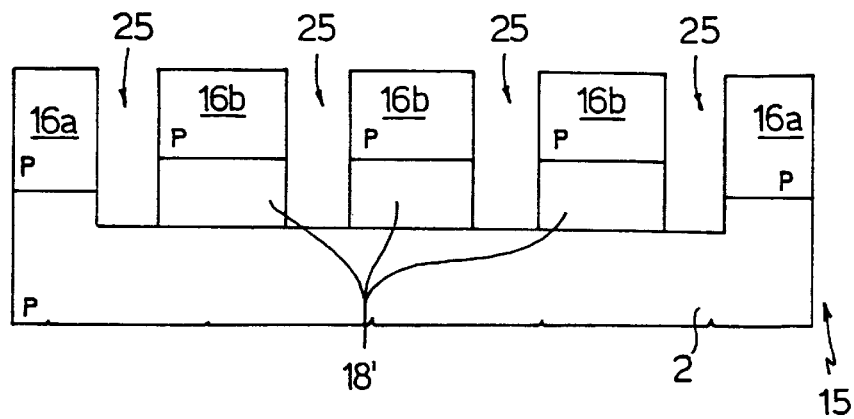

Subsequently, the hard mask 20 is removed. The wafer 15 is then immersed in an electrolytic solution in a galvanic cell. The wafer 15 is then subjected to an electrochemical etching step in hydrofluoric acid (e.g., is anodized), such as described for example in the article "Epi-micromachining" by P. J. French, P. T. J. Gennissen, P. M. Sarro, Microelectronics Journal 28 (1997), page 459. As discussed in this article, the highly doped regions (here buried regions 18) are selectively anodized, with formation of pores. As a result, the material of the buried regions 18 is transformed from monocrystalline silicon into porous silicon, forming porous regions 18', as shown in FIG. 10.

Figure 11:
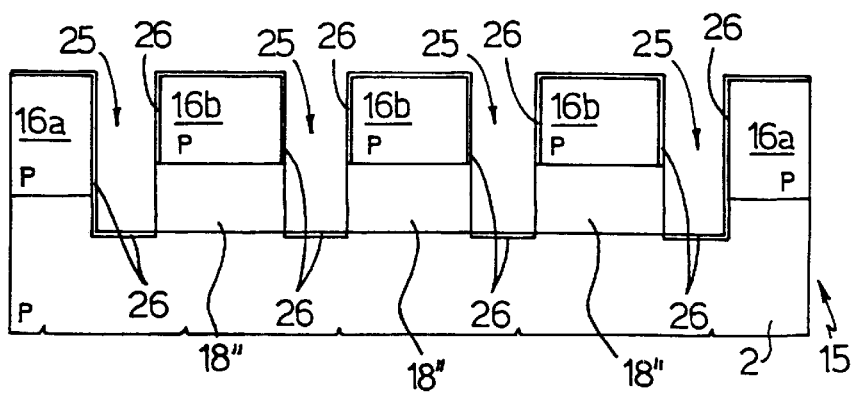
Figure 12:
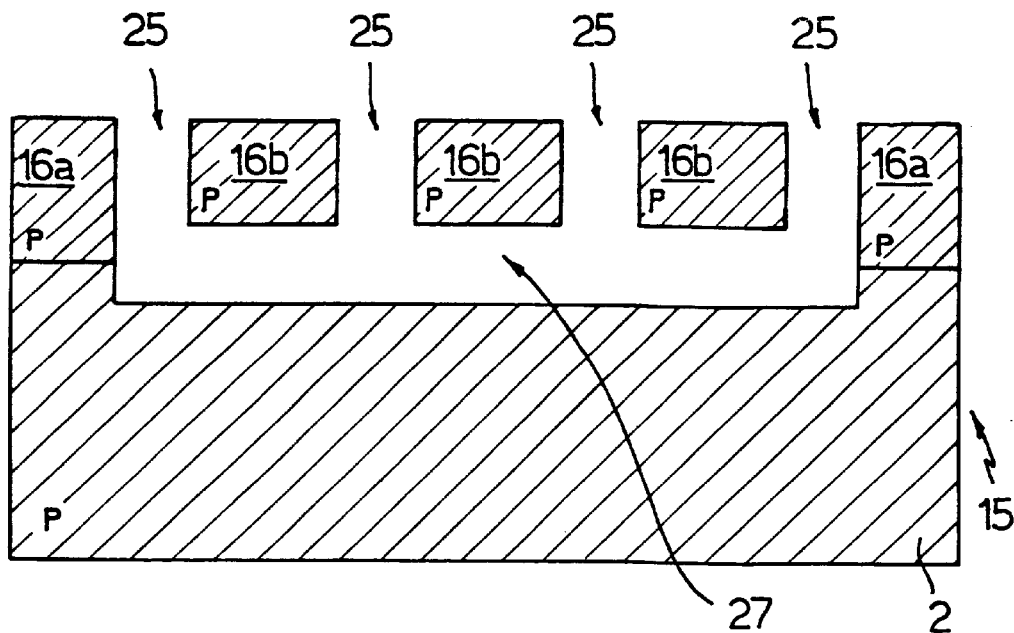

The wafer 15 is then subjected to oxidation in a humid environment (for example $H_2O_2$). In particular, the porous regions 18' react and are transformed into oxidized sacrificial regions 18". A thin oxide layer is also formed at the exposed silicon surfaces, as shown by layers 26 in FIG. 11. Subsequently, oxidized regions 18" and the thin oxide layers 26 are removed in hydrofluoric acid in an aqueous or anhydrous solution, providing the intermediate structure of FIG. 12. The inner epitaxial regions 16b of the epitaxial layer 16 are separated from one another and from the outer epitaxial region 16a by the trenches 25 and from substrate 2 by an air gap 27, and are supported by the pillars 16c (see FIG. 8).

Figure 13:
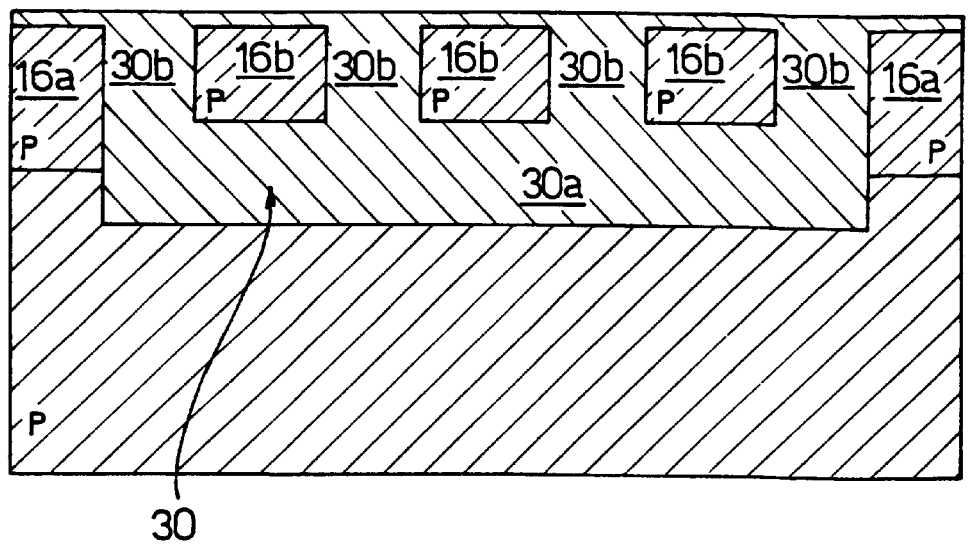

The process continues with thermal oxidation, whereby the exposed silicon portions form silicon dioxide regions. In one embodiment, by appropriately dimensioning the various regions, due to the volume increase of the material during oxidation, the silicon dioxide formed from the substrate 2, the outer epitaxial region 16a, the inner epitaxial regions 16b and the pillars 16c expands until it completely fills the trenches 25 and the air gap 27, thus providing the structure shown in FIGS. 13 and 14, respectively, in cross-section and in plan view. In this step, the pillars 16c are completely oxidized, since they have a much smaller area than the inner epitaxial regions 20b. In one embodiment, at the end of oxidation, the inner epitaxial regions 16b are surrounded below and laterally by a silicon dioxide region 30. The lower portion 30a of the silicon dioxide region 30 defines an SOI area isolating the substrate 2 from the individual inner epitaxial regions 16b (vertical SOI). The vertical portions 30b of the oxide region 30 define SOI areas isolating the inner epitaxial regions 16b from each other and from the outer epitaxial region 16a (horizontal SOI).

Inside and/or outside the inner epitaxial regions 16b, standard electronic components may be formed, according to conventional microelectronic techniques. In addition, sensors of different types (e.g., pressure, gas, temperature etc.), or microintegrated mechanical structures such as gyroscopes, micromotors and the like may be formed in these regions 16b.

It is thus possible to manufacture SOI substrates using techniques similar to those used for conventional microelectronic device fabrication, and therefore with costs which are far lower than those currently incurred in manufacturing SOI substrates. In addition, the use of steps which are well known and are already in use in manufacturing integrated circuits makes high levels of repeatability and reliability probable. In addition, it is possible to adapt the dimensions, and thus the electrical features of the SOI wafer, to the specific applications, by selecting the depth of the trenches 25 according to the final electrical characteristics required of the SOI structure.

Finally, it is apparent that many modifications and variations may be made to the method described and illustrated here, all of which come within the scope of the invention, as defined in the attached claims. In particular, the described method can be used irrespective of the conductivity type of the substrate and the epitaxial layer, and thus combinations of substrate/epitaxial layer of the P/P, N/N, P/N and N/P type can be formed, exploiting the etching selectivity of silicon with respect to the doping level of the layers and regions, and varying the etching parameters, such as hydrofluoric acid concentration, supplied current, and shape and material of the etching mask, as discussed in the aforementioned article by P. J. French et al.

What is claim is:

1. A method of forming a silicon-on-insulator wafer comprising:

forming a series of islands of silicon material suspended above a surface of a silicon substrate and separated from the surface by gaps; and oxidizing the surface and exposed portions of the series of islands to fill the gaps.

2. The method of claim 1, wherein the act of forming a series of islands comprises:

forming a series of implanted regions on the surface having a conductivity different that of the substrate;

growing an epitaxial layer of silicon on the series of implanted regions and on the surface, the epitaxial region having a conductivity different than that of the series of implanted regions;

etching trenches through the epitaxial region to the series of implanted regions; and selectively removing at least some of the series of implanted regions to form the gaps.

3. The method of claim 1, wherein the act of forming a series of implanted regions comprises forming a series of n-type or N+ implanted regions.

4. The method of claim 1, wherein the act of forming a series of implanted regions comprises forming a series of p-type or P+ implanted regions.

5. The method of claim 1, wherein forming the series of islands includes forming trenches extending respectively between the islands to the buried air gap.

6. The method of claim 5, wherein forming the series of islands includes:

forming doped, buried regions in portions of the substrate below the islands;

anodizing the buried regions in the silicon substrate, thereby obtaining porous sacrificial regions under the islands; and removing the porous sacrificial regions to form the gaps under the islands.

7. The method of claim 6, wherein the buried regions have a higher doping level than the substrate.

8. The method of claim 6, wherein the substrate has a first conductivity type and a first doping level and forming the buried regions includes:

forming in the substrate regions with a second conductivity type and a second doping level higher than the first doping level; and growing an epitaxial layer on the substrate, the regions with the second conductivity type forming the buried regions.

9. The method of claim 6, wherein removing the porous sacrificial regions includes oxidizing the porous sacrificial regions to form oxidized porous sacrificial regions; and removing the oxidized porous sacrificial regions.

10. The method of claim 5, wherein forming the trenches includes:

masking the substrate with a mask; and etching the trenches through gaps in the mask.

11. The method of claim 6, wherein the mask includes an outer protective portion, inner protective portions arranged adjacent to each other, and connection strips connecting the inner protective portions to each other and to the outer protective portion, the connection strips being spaced apart from each other by the gaps in the mask.

12. The method of claim 5, wherein forming the trenches exposes side portions of the islands, the method further comprising thermally oxidizing the side portions, thereby growing oxide regions that fill the trenches.

* * * * *

UNITED STATES PATENT AND TRADEMARK OFFICE
CERTIFICATE OF CORRECTION

PATENT NO. : 6,277,703 B1  
DATED : August 21, 2001  
INVENTOR(S) : Gabriele Barlocchi et al.

Page 1 of 1

It is certified that error appears in the above-identified patent and that said Letters Patent is hereby corrected as shown below:

Column 5,  
Line 30, "The method of claim 1" should read -- The method of claim 2 --  
Line 33, "The method of claim 1" should read -- The method of claim 2 --

Column 6,  
Line 29, "The method of claim 6" should read -- The method of claim 10 --

Signed and Sealed this

Thirtieth Day of April, 2002

Attest:

Attesting Officer

JAMES E. ROGAN  
*Director of the United States Patent and Trademark Office*